United States Patent [19]
Inokuti et al.

[11] Patent Number: 5,192,585
[45] Date of Patent: Mar. 9, 1993

[54] DIFFERENTIAL PRESSURE SEALING APPARATUS AND METHOD

[75] Inventors: Yukio Inokuti; Yo Ito, both of Chiba, Japan

[73] Assignees: Kawasaki Steel Corp.; Nihon Shinku Gijutsu Kabushiki Kaisha, Japan

[21] Appl. No.: 590,503

[22] Filed: Sep. 26, 1990

Related U.S. Application Data

[63] Continuation of Ser. No. 192,535, May 11, 1988, abandoned.

[30] Foreign Application Priority Data

May 20, 1987 [JP] Japan ................. 62-121016
Jun. 25, 1987 [JP] Japan ................. 62-156457
Aug. 5, 1987 [JP] Japan ................. 62-194499
Mar. 18, 1988 [JP] Japan ................. 63-63704

[51] Int. Cl.⁵ .................. B05D 3/12; B05D 3/00; C23C 14/56
[52] U.S. Cl. .................. 427/172; 427/295; 118/50; 118/718; 118/719; 118/733
[58] Field of Search .................. 118/50, 718, 719, 733; 427/172, 294, 295, 296

[56] References Cited

U.S. PATENT DOCUMENTS

| | | | |
|---|---|---|---|
| 2,963,001 | 12/1960 | Alexander | 118/718 |
| 2,972,330 | 2/1961 | Bugbee | 118/733 X |
| 2,989,026 | 6/1961 | Gardner et al. | 118/718 |

FOREIGN PATENT DOCUMENTS

| | | | |
|---|---|---|---|
| 2163512 | 7/1973 | France. | |
| 55-113875 | 9/1980 | Japan. | |
| 58-131470 | 8/1983 | Japan. | |
| 62-23982 | 1/1987 | Japan | 118/719 |

OTHER PUBLICATIONS

English translation of Japanese Patent No. 62-23982.

*Primary Examiner*—Evan Lawrence
*Attorney, Agent, or Firm*—Austin R. Miller

[57] ABSTRACT

A differential pressure sealing apparatus and method for processing a continuously moving elongated sheet through successively different stages of vacuum. A vacuum chamber is provided with an inlet and a guide roller for the incoming sheet with the sheet urged against the guide roller over a wrap contact angle of 15 to 120 degrees. To resist the entrance of air into the chamber, a sealing structure encompasses at least portions of the entrance, the guide roller and the sheet.

17 Claims, 15 Drawing Sheets

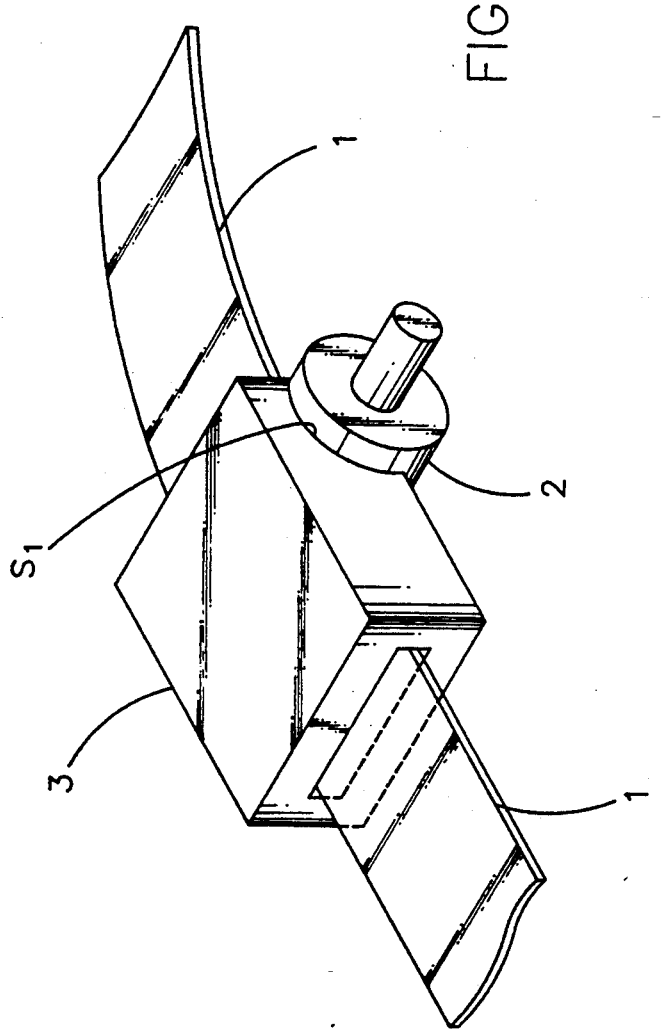
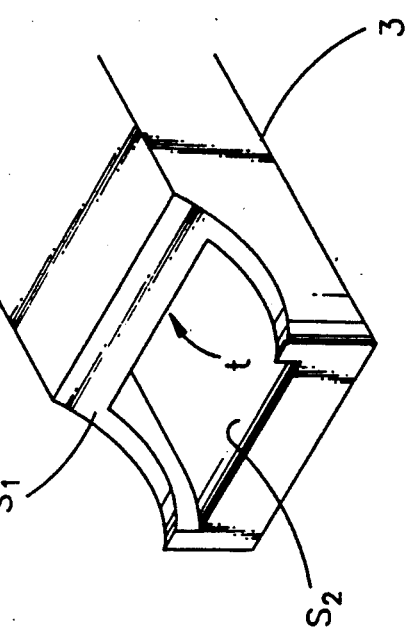
FIG 2(a)
FIG 2(b)

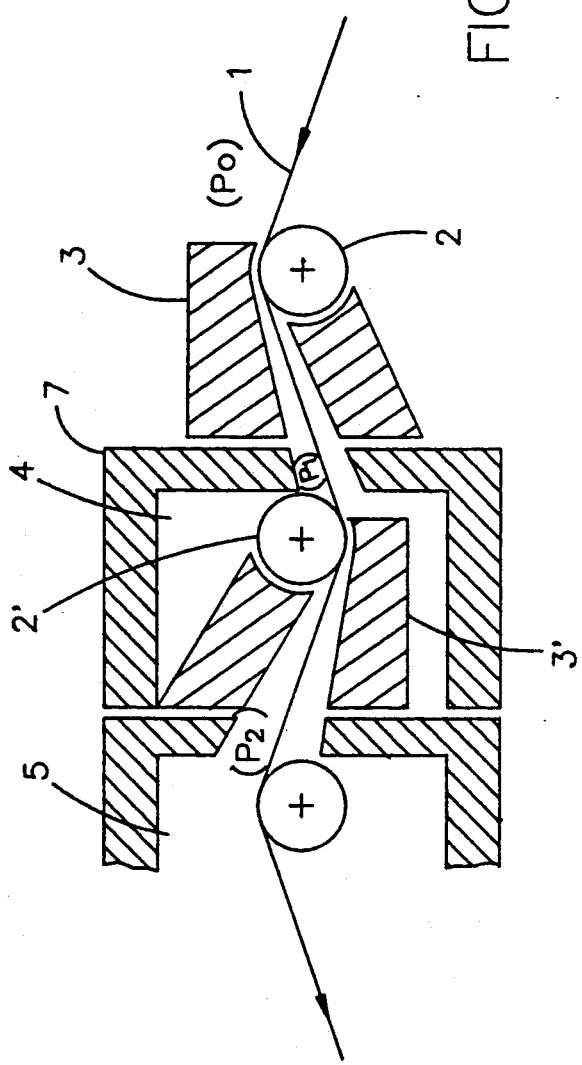
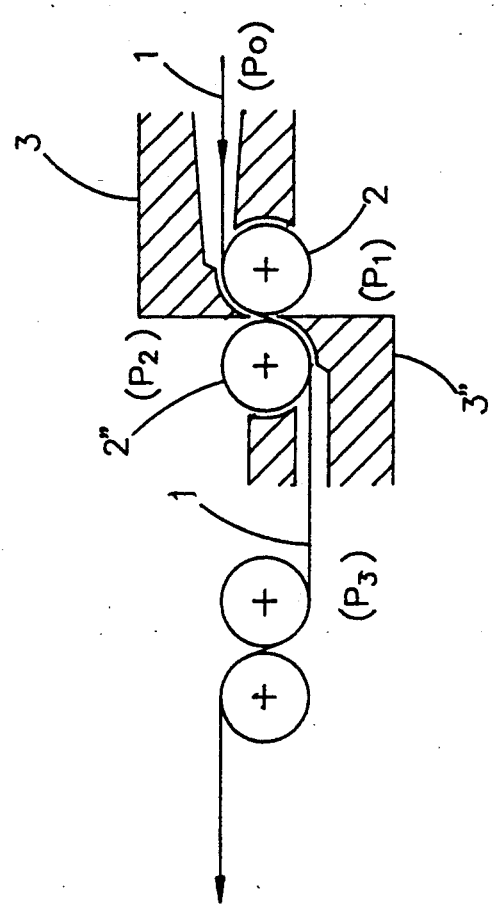
FIG 9
FIG 10

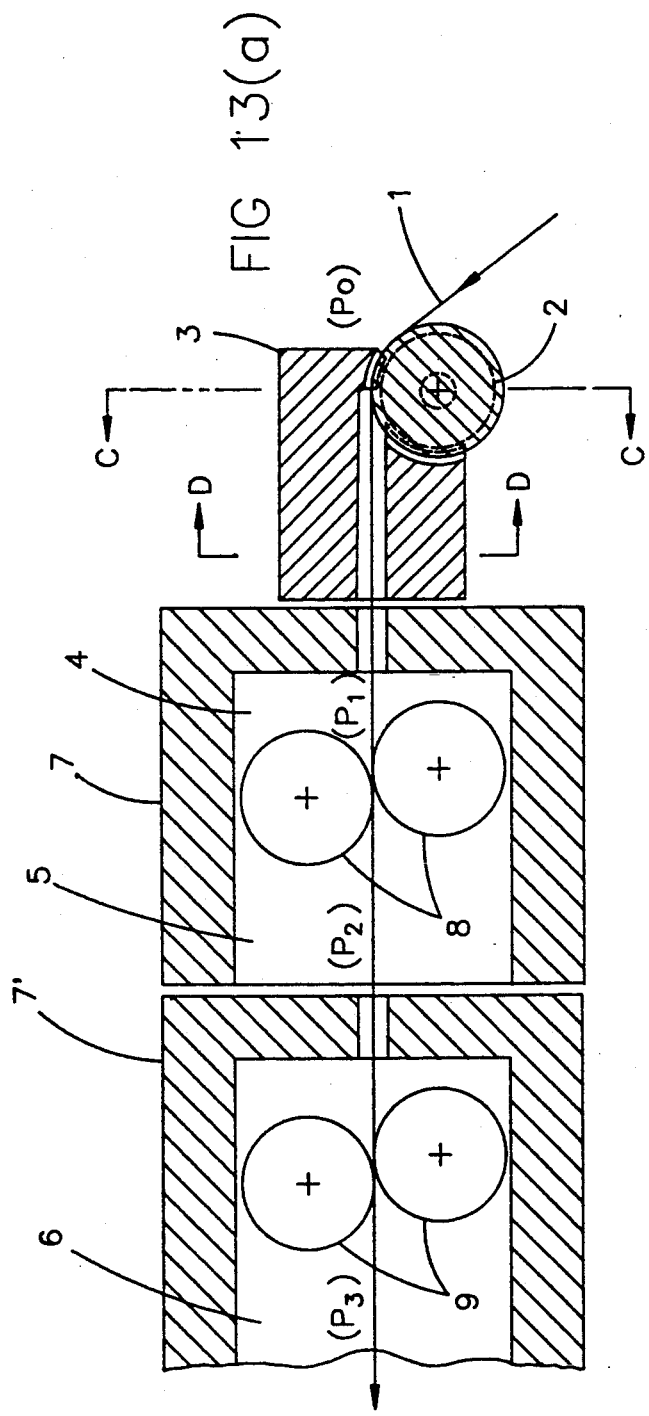
FIG 13(a)
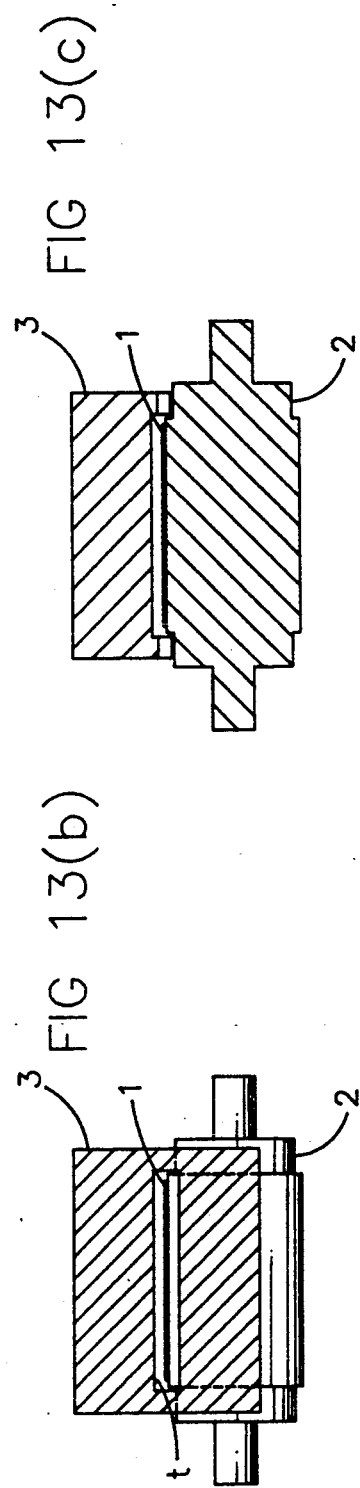
FIG 13(c)
FIG 13(b)

DIFFERENTIAL PRESSURE SEALING APPARATUS AND METHOD

This application is a continuation of application Ser. No. 07/192,535, filed May 11, 1988, now abandoned.

This invention relates to a differential pressure sealing apparatus and method effective for maintaining continuously a plurality of different degrees of vacuum or negative pressure at spaced locations along the length of a continuously moving object such as a sheet metal plate, strip, belt or other work object, all of which are hereinafter and in the claims collectively referred to as an "elongated sheet".

When surface coating of sheet metals is performed by so-called dry plating, using processes such as vacuum deposition, ion plating, sputtering etc., a long thin sheet such as a cold-drawn or hot-drawn steel belt is continuously subjected to a so-called "air-to-air" treatment. In this procedure the degree of vacuum applied to the surface of the sheet is alternately raised and lowered while the elongated sheet reaches the dry plating area by passing through a number of spaced-apart areas having vacuum differences among them. These are hereinafter referred to as "differential pressure chambers". Differential-pressure seals are provided along the path of movement of the sheet which permit the continuous passage of the sheet while maintaining the pressure differences among the respective differential pressure chambers. In this specification a differential-pressure sealing apparatus is described which effectively provides differential-pressure seals without causing damage to the sheet or other work object being processed.

KNOWN TECHNOLOGY

Many proposals have already been made for conducting air-to-air plating procedures for metals. For example, reference is made to U.S. Pat. Nos. 2,384,500; 2,972,330 and 2,996,410, as described in Mitsubishi Juko Giho, Vol. 21 (1984), No. 6, pp. 125-131. With the progress of precision manufacturing technologies in recent years, the practical development of these proposals is proceeding. Among these sealing methods, especially in the reference cited last, the sealing area is enlarged so that the elongated sheet of metal is sandwiched between a pair of rollers with their axes slightly offset in the direction in which the sheet is moving, and the elongated sheet follows along the roller surfaces.

Recently, moreover, in Japanese Patent Laid-open No. 62-13,572, an attempt has been disclosed in which a seal bar and an adaptor enclosing the sheet material are combined, and the pressure difference is maintained within this enclosure. In either case, however, since the sheet material is sandwiched and compressed between a pair of rollers and made into a sheet passing between them, the treated sheet material undergoes bending and compression stresses on its front and back surfaces, and the tension on the sheet is increased.

These tension forces and the local surface pressures generated have adverse effects on the quality of the product; for example, when the air-to-air method is applied to grain oriented silicon steel sheets, it has been found that the magnetic properties of the plate are caused to deteriorate.

Moreover, in addition to this problem, it has also been indicated recently that when brittle elongated sheets comprising a metal such as the above-mentioned grain oriented silicon steel are treated, breakage of the sheet or plate tends to occur due to contact with the sealing device itself, because of vibration.

SUMMARY OF THE INVENTION

It is an object of this invention to provide a differential-pressure sealing apparatus and method which overcomes the foregoing disadvantages, and which is suitable for treatment of elongated sheets by processes including the air-to-air method, and which can produce effective differential-pressure seals without causing the quality of the product to deteriorate or the sheets to break.

BRIEF DESCRIPTION OF THE DRAWINGS

The foregoing and other objects of the invention will further become apparent hereinafter and in the drawings of which:

FIGS. 2(a) and 2(b) are diagrammatic views of sealing devices in accordance with this invention and portions thereof, FIG. 2(b) is shown in an inverted position in order more clearly to illustrate important details, FIG. 9 is a diagrammatic view of a portion of an apparatus comprising an alternative embodiment of this invention, FIG. 10 is a view in side section showing portions of a still further alternative embodiment of the invention, FIG. 13(a) is a fragmentary view in side section showing still a further alternative embodiment of this invention, FIGS. 13(b) and 13(c) are sectional views taken as indicated by the lines and arrows C—C and D—D, respectively.

DETAILED DESCRIPTION OF THE INVENTION

Figure 1A:
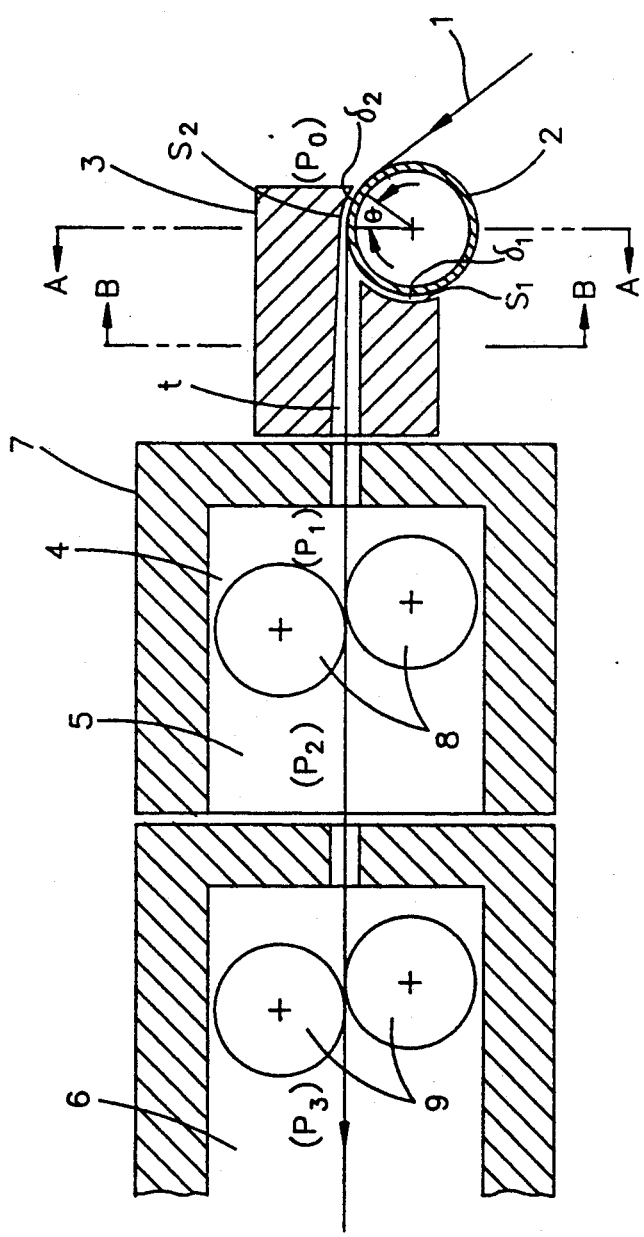
FIG. 1(a) is a view in side section showing one embodiment of sealing device in accordance with this invention.
Figure 1C:
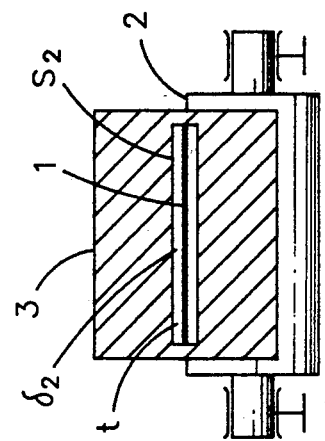
FIGS. 1(b) and 1(c) are sectional views taken as indicated by the lines and arrows A—A and B—B, respectively.
Figure 1B:
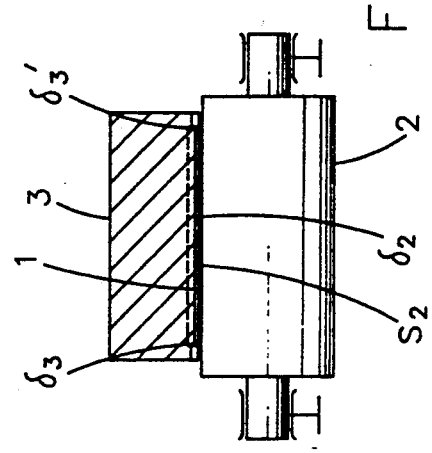

Turning now to the specific forms of the invention selected for illustration in the drawings, the right-hand portion of FIG. 1 shows one form of a differential-pressure sealing apparatus according to this invention, applied (by means not shown) in particular to the atmospheric pressure portion of region $P_0$-$P_1$. Vacuum is applied (by means not shown) at one or several places to the chamber, as in the U.S. Pat. No. 2,972,330 to Bugbee, for example. FIG. 1 also shows several spaced areas such as ($P_1$-$P_2$) and ($P_2$-$P_3$) having pressure differences among them. In this figure, the number 1 refers to an elongated sheet moving from right to left as indicated by the arrows. The number 2 refers to a guide roller which guides the elongated sheet 1 as it is conducted into the space 4, and 3 is a sealing attachment, which is an important feature of this invention and which is operative in combination with the guide roller 2. The numbers 4, 5 and 6 designate differential pressure chambers which are constructed so that the degree of vacuum existing in a given chamber may be increased from atmospheric pressure $P_0$ to the negative pressures $P_1$, $P_2$, $P_3$ . . . increasing in the order of the subscripts, over several spaces with pressure differences, between them, while maintaining the pressure differences continuously as the elongated sheet 1 advances through the treatment method.

On the inner side of a differential-pressure casing 7, which corresponds to a boundary between pressure regions $P_0$-$P_1$, the guide roller 2, is provided on which the elongated sheet 1 is passed.

The elongated sheet 1 is guided on the outside of guide roller 2, preferably at a wrap contact angle $\theta$ (FIG. 1(a)).

The sealing attachment 3 (FIG. 1) surrounds approximately half of the outer surface of the guide roller 2. It includes a concave arcuate sealing surface $S_1$ shaped to form an extremely small or narrow gap $\delta_1$ with the outer surface of the guide roller 2, except for the inlet region through which the incoming elongated sheet 1 passes. It also includes a further concave arc-shaped sealing surface $S_2$ (FIG. 2) which is shaped to form extremely small gaps $\delta_2$ and $\delta_3$, $\delta_3'$, (FIG. 1); $\delta_3$, $\delta_3'$, with the back surface and the two sides of the elongated sheet 1 in the winding region, and a slit t (FIGS. 1 and 2) which has a much larger opening than the cross sectional dimensions of the elongated sheet 1. The latter opening t is located inside the second concave arc-shaped sealing surface $S_2$ and connected with it, in a direction tangential to the guide roller 2. Its outer appearance is shown in FIG. 2(a), while the concave arc-shaped sealing surfaces $S_1$ and $S_2$ which face the guide roller 2 are shown in an inverted form in FIG. 2(b).

Turning further to the form of the invention shown in FIG. 1, the pressure differences ($P_1$-$P_2$) and ($P_2$-$P_3$) between the differential pressure chambers 4 and 5 and 5 and 6 are much smaller than the above-mentioned pressure difference ($P_0$-$P_1$), and in these chambers roller seals are provided by means of spaced pairs of sealing guide rollers 8, 8 and 9, 9 which have their axes displaced in the direction in which the elongated sheet passes through the apparatus, one being in an upstream position and the other in a downstream position in relation to the direction in which the elongated sheet is moving.

Furthermore, it is unavoidable for $\delta_2$ and $\delta_1$, shown in FIG. 1, to become somewhat too large when the width of the elongated sheet is changed, and it is also suitable to provide auxiliary plates which can move in the axial direction of the roller and are air-tight, so that the gaps can be continuously controlled to be very small.

Since the single guide roller which guides the introduction of the elongated sheet into the apparatus is preferably provided with a sealing attachment 3 (see FIGS. 2(a) and 2(b)) which has a concave arcuate sealing surface which is separated only by an extremely small gap from the roller surface, which gap includes the elongated sheet, not only is an effective differential-pressure seal formed, but the elongated sheet is guided on the above-mentioned guide roller at a angle of wrap. Further, since the elongated sheet in this wrap area is attracted and held tightly to the outer surface of the roller 2 it is not possible for strong surface pressure to be applied to the elongated sheet. This would have a harmful effect on the product quality. Nor can vibration, even if present, be applied to the elongated sheet in a manner to cause it to break.

When the elongated sheet 1 is wrapped on the guide roller 2 and passes through the apparatus the product quality sometimes differs simply because of an undesirable angle of wrapping, due to the wrap angle $\theta$ and the tension of the elongated sheet 1; therefore, it is desirable for the wrap contact angle to be limited to the range of 15°–120° and the tension to be set in the range of 0.1–2.0 kg/mm$^2$.

The foregoing principles will further be explained on the basis of an actual example in which a TiN coating (0.8 μm thick) was formed on a silicon steel plate, manufactured under the conditions set forth below, by means of an ion plating treatment using the apparatus of FIG. 1.

The silicon steel sheet used in the actual example was manufactured as follows. A silicon steel slab with the composition shown in Table 1 was heated for 4 hours at 1,340° C. after which it was drawn while hot and finished to form a hot-drawn sheet 2.0 mm thick. After this, it was cold-drawn twice, with an intermediate annealing for 3 minutes at 950° C. between these drawings, and a final cold-drawn sheet 0.23 mm thick was formed. Then, a decarburization primary recrystallization annealing step was performed in moist hydrogen at 830° C., after which an annealing separator agent composed of MgO (35%), Al$_2$O$_3$ (60%), TiO$_2$ (4%), and SrSO$_4$ (1%) was applied to the surface of the steel sheet, and a secondary recrystallization annealing step was performed for 5 hours at 850° C. After this, a purification annealing step was performed in dry hydrogen at 1,180° C. for 8 hours, and the oxide on the surface of the steel sheet was then removed by acid washing. The steel sheet was then finished to a center line mean roughness of Ra=0.1 μm by electrolytic polishing.

TABLE 1

| C | Si | Mn | Se | Sb | Mo |
|---|---|---|---|---|---|
| 0.043% | 3.36% | 0.72% | 0.022% | 0.025% | 0.013% |

Figure 3:
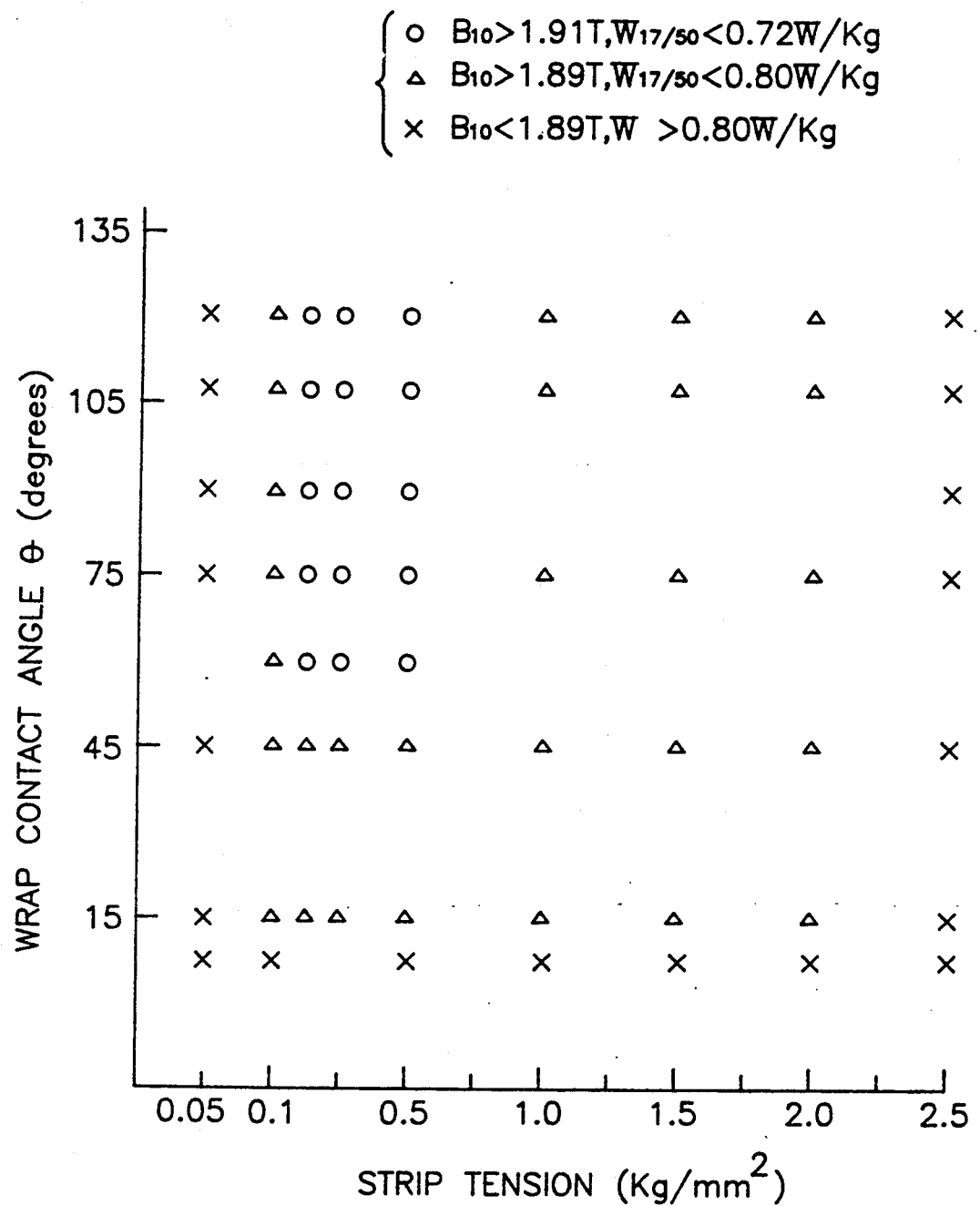
FIG. 3 is a graph showing the effects of magnetic properties in response to changes of wrap contact angle $\theta$ (the ordinate) and the tension in $kg/mm^2$ (the abscissa)

FIG. 3 is a graph showing the effects on the magnetic properties (magnetic flux density $B_{10}$ and the iron loss $W_{17/50}$) of an elongated steel sheet when the wrap content angle $\theta$ and the tension were varied. The circles indicate excellent magnetic properties, the triangles indicate acceptable properties and the crosses indicate unacceptable properties. It is clear in FIG. 3 that good magnetic properties were shown, as marked by the circles and triangles in the graph, when the wrap contact angle with the guide roller 2 was greater than 15° and preferably greater than 60°, and the tension was in the range of 0.1-2.0 kg/mm$^2$, and preferably 0.2-0.5 kg/mm$^2$. In contrast to this, when the wrap contact angle $\theta$ was small and the tension on the steel sheet was less than 0.1 kg/mm$^2$, the magnetic properties were adversely affected by vibration of the steel sheet when it was conducted to the differential pressure chambers, as marked with crosses in the graph, and breakage and other damage were caused. Moreover, the magnetic properties were also adversely affected when the tension was greater than 2.0 kg/mm$^2$, as marked by crosses in the graph.

Furthermore, when the wrap contact angle $\theta$ was greater than 120°, the sealing lengths differed between the upper and lower sealing attachments 3 and the roller, as is clear for example, from FIG. 1, and the amounts of air flowing through the gaps became asymmetrical; therefore, considerable sheet breakage was caused due to unevenness in the steel sheet. For this reason, it is highly desirable for the wrap contact angle $\theta$ to be less than 120°.

Figure 4:
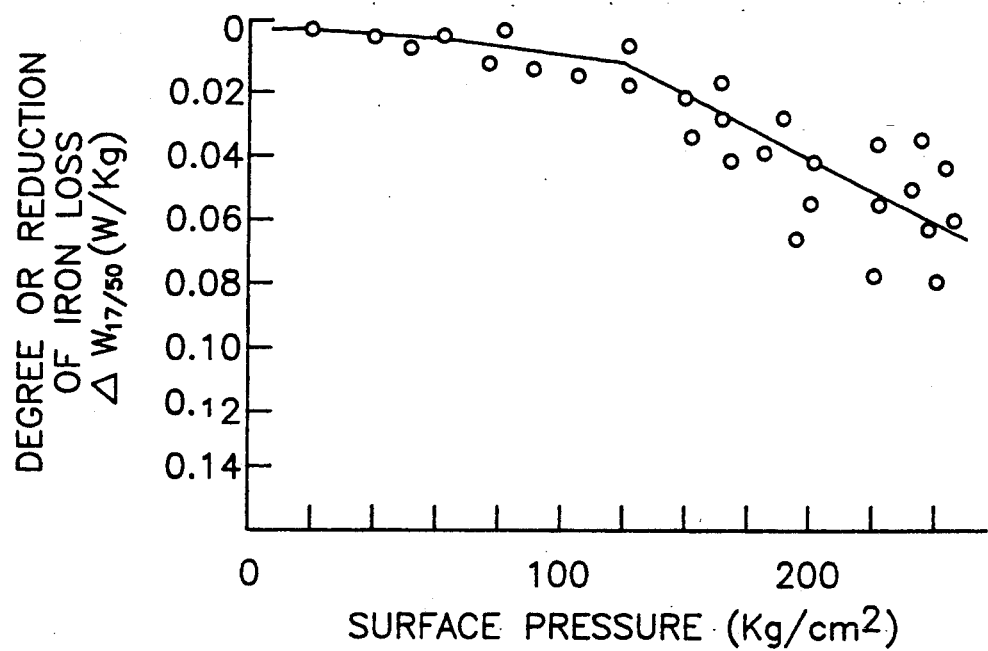
FIG. 4 is a graph showing the relationship between degree of reduction of iron loss of an elongated sheet (ordinate) and surface pressure exerted by the roller seal (abscissa)

The case of quality deterioration of an elongated sheet which has been tightly compressed by a pair of rollers is shown in FIG. 4, in which, after a grain oriented silicon steel sheet was finished by annealing, its surface oxide was removed and it was polished to a mirror surface with a center line mean roughness Ra=0.1 μm; the degree of reduction of iron loss, which depends on the surface pressure exerted by the roller seal in this case, is shown in FIG. 4. As the surface pressure was increased, and in particular when it exceeded 100 kg/cm$^2$, the iron loss reduction was marked. In contrast to this, when this invention was used, a reliable differential-pressure seal was achieved by means of a sealing attachment of this invention on a single guide roller, with no possibility of producing excessive surface pressure.

As a further example a TiN coating (0.8 μm thick) was formed on a silicon steel sheet by ion plating, using a PVD apparatus which incorporated the differential-pressure sealing device shown in FIG. 1, and the magnetic properties of the product obtained were investigated.

The results, together with the conditions prevailing at the time the sheet passed through the apparatus are shown in Table 2.

TABLE 2

| | Wrap contact angle $\theta$ (degrees) | Tension (kg/mm$^2$) | Magnetic flux density $B_{10}$ (T) | Iron loss $W_{17/50}$ (W/kg) |
|---|---|---|---|---|
| Suitable example | 75 | 0.3 | 1.94 | 0.68 |
| Comparison example | 40 | 3.5 | 1.89 | 0.81 |

The above-mentioned silicon steel sheet was produced as follows. A silicon steel slab with the composition shown in Table 3 was heated for 3 hours at 1,440° C., after which it was rolled while hot and made into a hot-rolled sheet 1.8 mm thick. After this, it was cold-rolled twice, with an intermediate annealing at 1,050° C. between these rollings, and a final cold-rolled sheet 0.23 mm thick was formed. Then, a decarburization annealing step was performed in moist hydrogen at 850° C., after which an annealing separator agent composed of MgO (35%) and Al$_2$O$_3$ (65%) was applied to the surface of the steel sheet, and a secondary recrystallization annealing was performed by raising the temperature from 850° C. to 1,050° C. at 15° C./hr. After this a purification annealing step was performed in dry hydrogen at 1,200° C. for 8 hours, and the oxide on the surface of the steel sheet was then removed by acid washing. The steel sheet was then finished to a center line mean roughness of Ra=0.1 μm by electrolytic polishing.

TABLE 3

| C | Si | Mn | Al | Se | Mo | N |
|---|---|---|---|---|---|---|
| 0.058% | 3.39% | 0.76% | 0.026% | 0.021% | 0.018% | 0.0078% |

Furthermore, the differential-pressure sealing device according to this invention is also extremely useful when applied to a grain oriented silicon steel sheet and when one is removing oxides after a finishing annealing treatment. It is also particularly useful when a beneficial iron loss reduction of grain oriented silicon steel sheet is obtained by forming a tension film by way of a mixed phase of at least one nitride and/or carbide of Ti, Zr, V, Nb, Ta, Cr, Mo, Co, Ni, Mn, Al, B, or Si and oxides of Al, Ni, Cu, W, Si, or Zn with the base steel by means of dry plating after the sheet passes through the step of mirror finishing of Ra≦0.4 μm (see Japanese Patent Laid-open Nos. 62-1,820, 62-1,822, etc.).

In particular, this invention can also be applied, of course, in cases in which a super low iron loss is made possible beneficially by the effective use of elastic tension in both steel plate surfaces by dry plating at a temperature of 100° C.–1,100° C. (see Japanese Patent Laid-Open No. 62-30,302).

Suitable ranges for the wrap contact angle $\theta$ and the tension of the elongated sheet 1 are as started above; however, when the values set are near the lower limits of the above-mentioned ranges, there is in fact a chance that vibration, etc. will be caused in the elongated sheet 1 as it passes through. In such a case, the suction and tight adhesion of the elongated sheet 1 to the outer surface of the guide roller 2 in the winding region of the roller can be effectively provided.

Figure 5A:
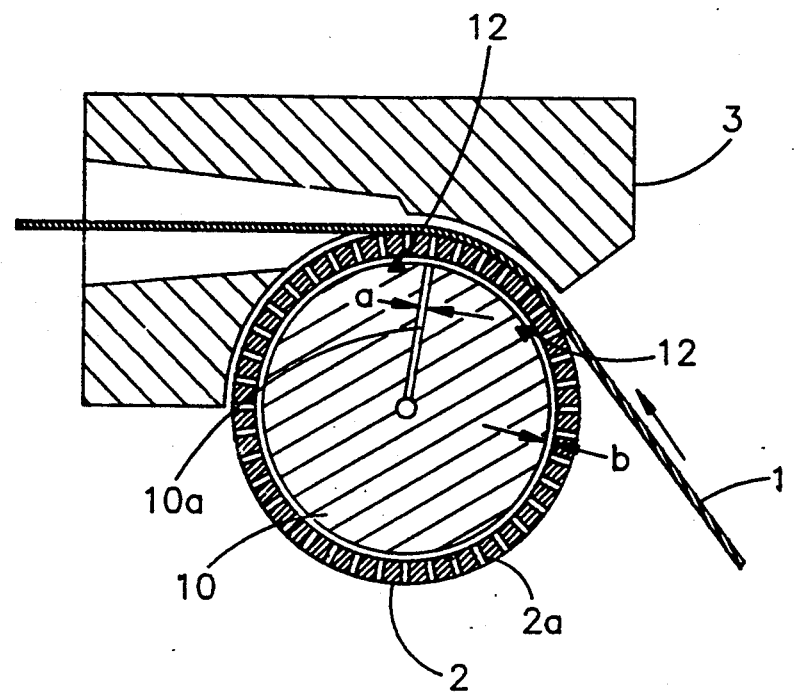
FIG. 5(a) is a view in side section of a portion of an apparatus, showing an alternative form of the invention.
Figure 5B:
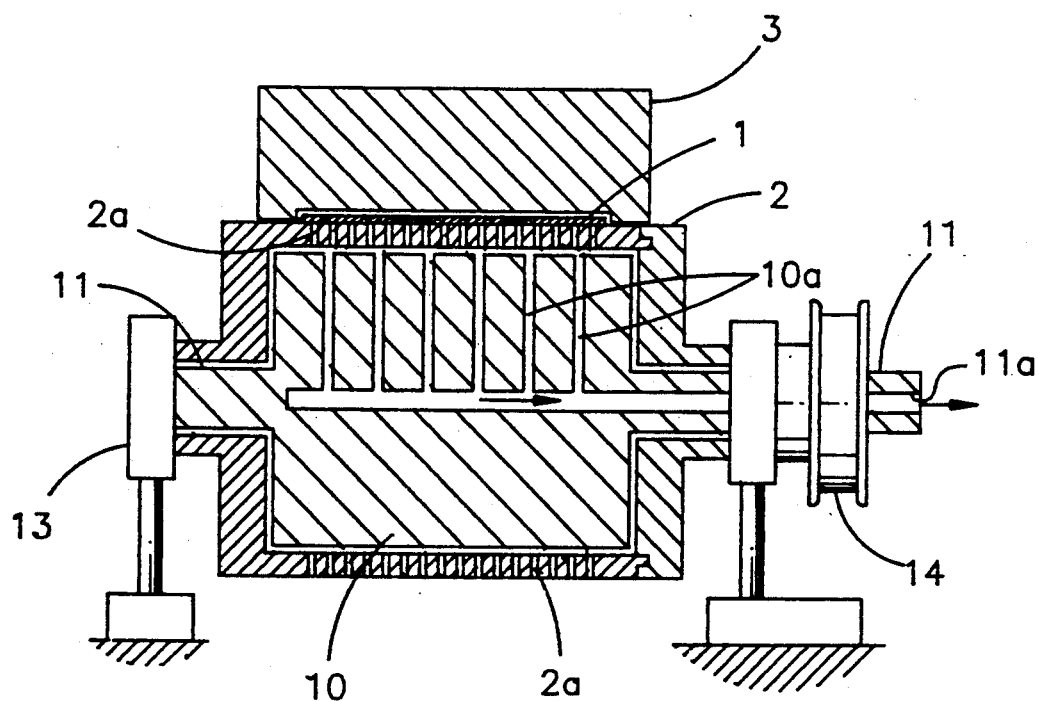
FIG. 5(b) is a sectional view taken through the apparatus appearing in FIG. 5(a)
Figure 5C:
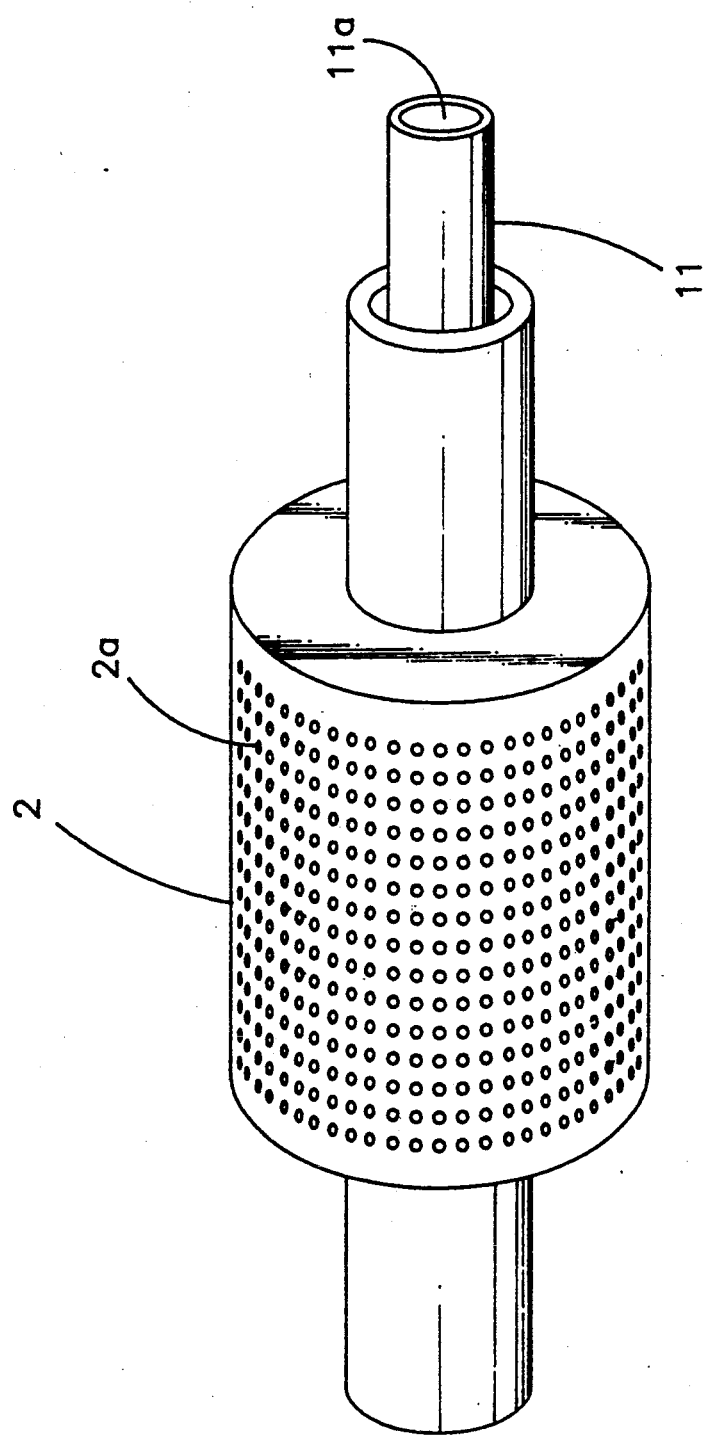
FIG. 5(c) is a view in perspective of a portion of the apparatus of FIG. 5(a)

FIG. 5 shows an especially suitable example of the differential-pressure sealing device of this invention in which the single guide roller 2 is a hollow roller with numerous pores 2a extending through its outer surface, and this hollow roller 2 encloses a fixed cylindrical member 10 which has a number of suction openings 10a (see also FIG. 5(b)), which are connected to a suction opening 11a provided in a fixed axle 11 (FIG. 5(b))

which supports the said part 10. The elongated sheet 1 is sucked and held tightly to the outer surface of the roller 2 in the winding region by the operation of a vacuum pump (not shown) during the time the elongated sheet 1 passes through the apparatus.

Furthermore, suitable sizes for the pores 10a in the outer surface of the guide roller 2 are about 0.1-2.0 mm. The suction force which sucks and tightly adheres the elongated sheet 1 to the outer surface of the roller is determined by the diameter (a) of the suction openings 10a and the gap (b) formed between the inner surface of the guide roller 2 and the cylindrical part 10 (see FIG. 5(a)). If these are set so that (a)>>(b), the air which is sucked in from holes outside the winding region is negligible. Moreover, in order to provide reliable suction of the elongated sheet 1 in the winding region of the guide roller 2, it is also suitable to apply a sealing material 12 to the surface of the cylindrical part 10.

In this device, it is desirable that the single guide roller 2 consist of a hollow roller and that the inside of the hollow roller be provided with a magnet which attracts the elongated sheet tightly against the outer surface of the roller in the entrance area.

Figure 6A:
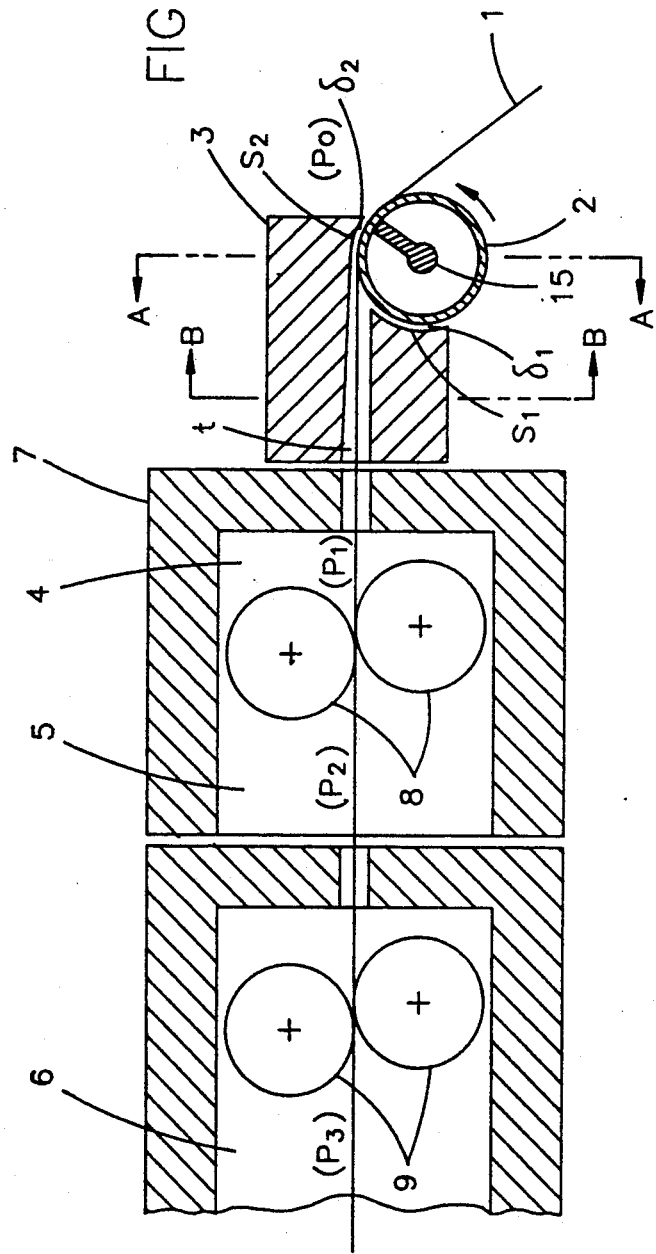
FIG. 6(a) is a view in side section showing one embodiment of sealing device in accordance with this invention, FIGS. 6(b) and (c) are sectional views taken as indicated by the lines and arrows A—A and B—B, respectively.
Figure 6C:
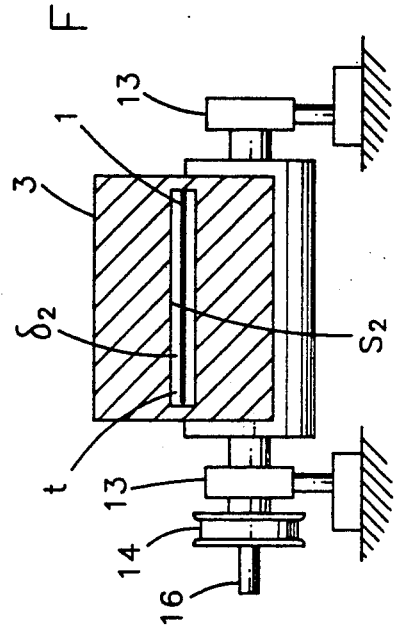

FIG. 6 also shows several spaced areas such as ($P_1-P_2$) and ($P_2-P_3$) having pressure differences among them. In this figure, the number 1 refers to an elongated sheet moving from right to left as indicated by the arrows. The number 2 refers to a hollow guide roller which guides the elongated sheet 1 as it is conducted into the space 4. 15 is a magnet placed inside the guide roller 2, and 3 is a sealing attachment, which is an important feature of this invention and which is operative in combination with the guide roller 2 whether the roller 2 is hollow or not and whether or not it includes the magnet 15. The numbers 4, 5 and 6 designate differential pressure chambers which are constructed so that the degree of vacuum existing in an any given chamber may be increased from atmospheric pressure $P_0$ to the negative pressures $P_1, P_2, P_3 \ldots$ increasing in the order of the subscripts, over several spaces with pressure differences, between them, while maintaining the pressure differences continuously as the elongated sheet 1 advances through the treatment method.

Figure 6B:
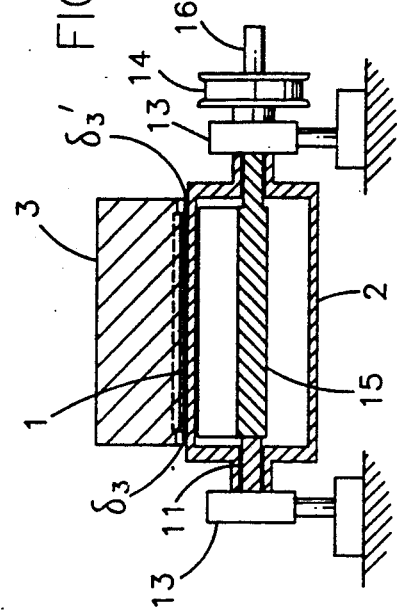
Figure 7:
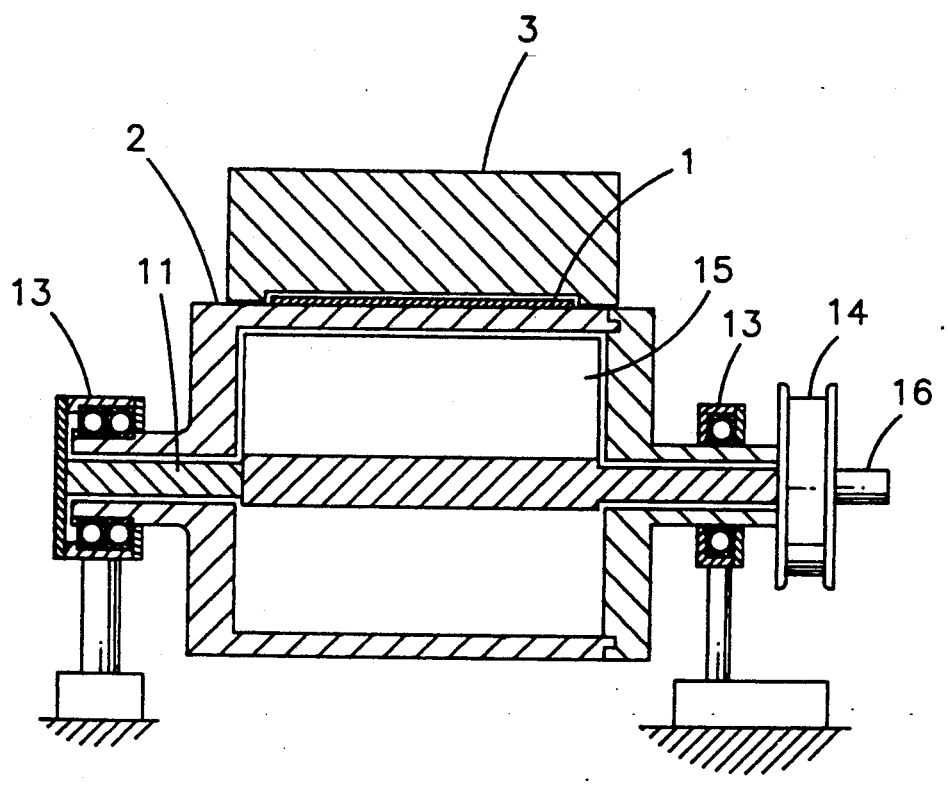
FIG. 7 is a sectional view taken through a seal according to this invention.

On the inner side of a differential-pressure casing 7, which corresponds to a boundary between pressure regions $P_0-P_1$, the guide roller 2, on which the elongated sheet 1 is passed, is supported by a bearing 13 (FIGS. 6(b) and 7) so that it can rotate. The magnet 15 is located inside the guide roller 2 (an electromagnet is assumed in this example) and is fixed by means of a support 11, which is connected to a magnetism-controlling electrode 16 connected in the usual way for selectively applying and removing a magnetic field. These parts are arranged so that only the guide roller 2 but not the magnet 15 is rotated by a drive device (which may be a conventional motor or the like, not shown in the drawings), by way of a pulley 14.

Figure 8:
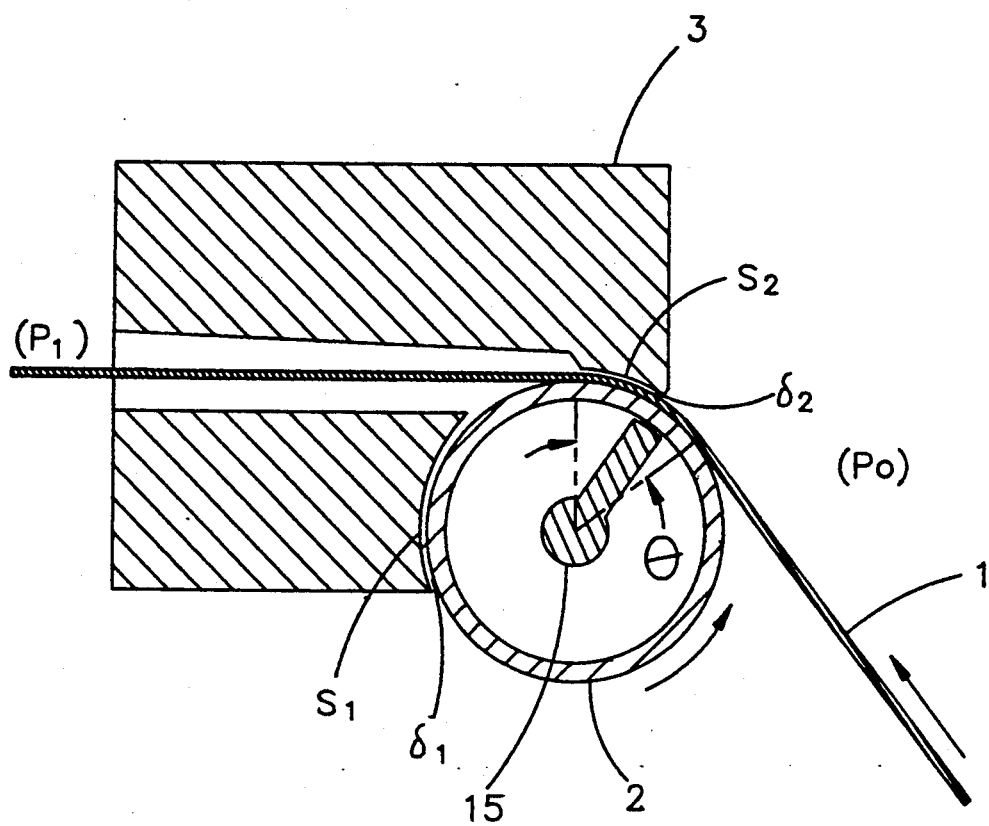
FIG. 8 is an enlarged sectional view showing the manner in which the seal portion of FIG. 6 is maintained according to this invention.

FIG. 7 shows the structure by which the magnet 15 is fixed inside the guide roller 2. The elongated sheet 1 is guided on the outside of guide roller 2, preferably at a shallow wrap contact angle θ (FIG. 8).

The magnetic force of magnet 15, when it consists of an electromagnet, can be regulated suitably by regulating the current applied. In order for magnet 15 to act effectively on the elongated sheet 1 from within the guide roller 2, the end of the magnet, as shown in FIG. 7, is located adjacent to the inner wall of the guide roller 2 and at a substantially central part of the long dimension of the elongated sheet 1, in the wrap region.

FIG. 9 shows a modified form of the invention in which the high pressure differences from $P_0$ to $P_1$ and from $P_1$ to $P_2$ were achieved more advantageously by twice repeating the differential-pressure seal structure shown in FIG. 1. FIG. 10 shows an example in which the sealing effectiveness is further increased by twice repeating the differential-pressure seal described above, using two differential-pressure sealing devices of this invention placed opposite each other and close to the guide rollers 2 and 2″, and wherein the elongated sheet 1 is not squeezed by or between the rollers 2, 2″.

Figure 11:
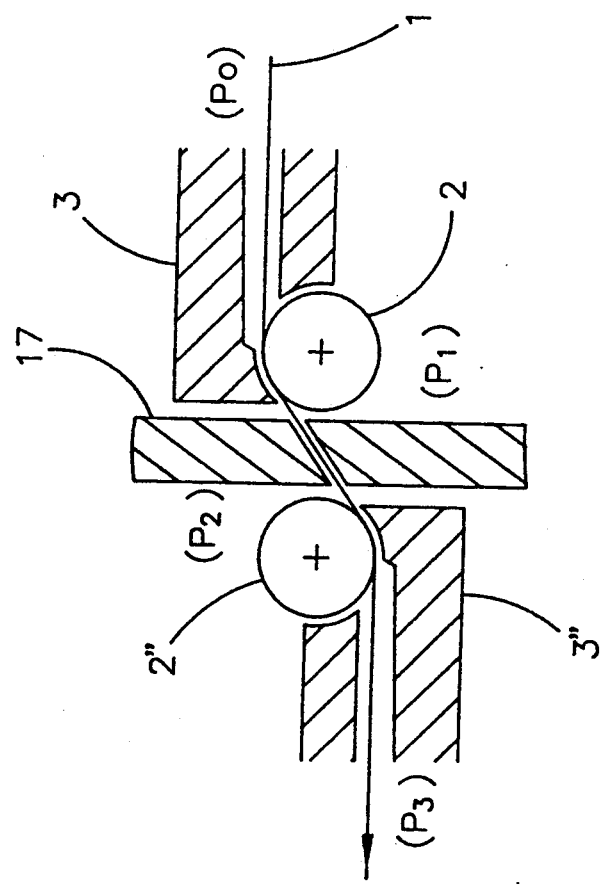
FIG. 11 is a fragmentary sectional view showing still another embodiment.

Furthermore, FIG. 11 shows a case in which the sealing effectiveness of the apparatus is increased by repeating the differential-pressure seal twice, using two differential-pressure sealing devices with guide rollers 2 and 2‴ placed opposite each other with a space between them and a plate 17 with a slit 17 inserted between them.

In all of the above-mentioned cases, the differential-pressure sealing device of this invention, by using very small gaps of about 0.01-0.5 mm, was able efficiently to maintain pressure differences of about 1.5-20 fold between adjacent pressure difference chambers when the width of the elongated sheet was, for example, 300-1,200 mm and its thickness was 0.1-0.2 mm.

Figure 12:
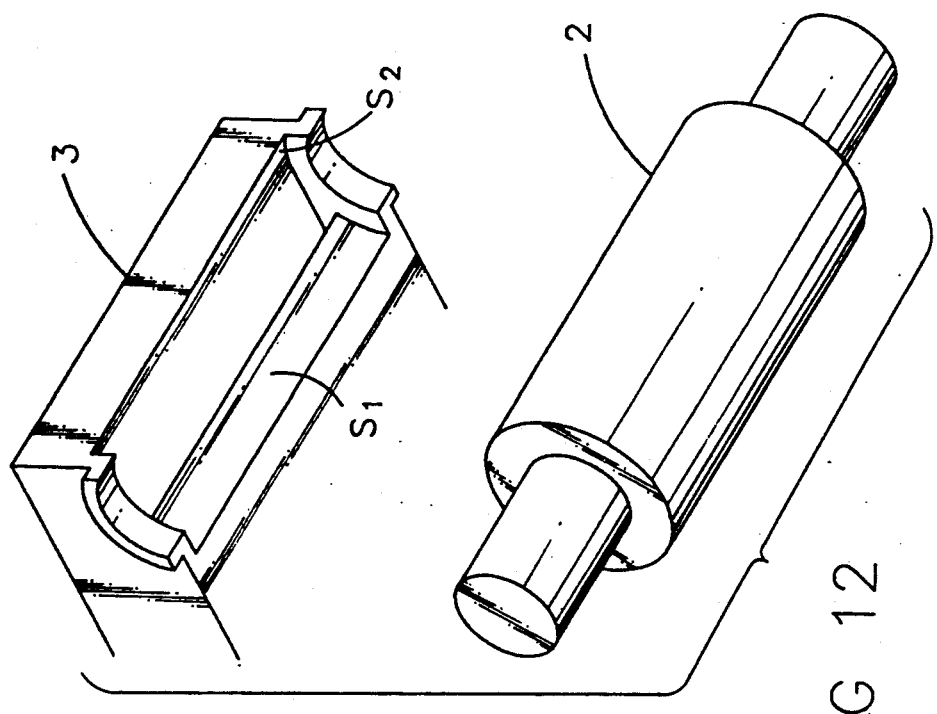
FIG. 12 is an exploded view, taken in perspective, showing still a further alternative embodiment of this invention.
Figure 14:
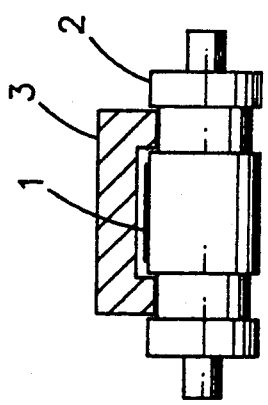
FIG. 14 is a sectional view of a portion of a further embodiment according to this invention.

In FIG. 12 an example is shown in which the differential-pressure seals on the sides of the device are increased by covering the end surfaces of the guide roller 2 adjacent to the journals and creating additional differential-pressure seals there, and FIGS. 13, 14 show examples in which the differential-pressure seals on the sides of the device are increased further by forming steps or concave portions in the end surfaces of the guide rollers 2 adjacent to the journals and enclosing them, with sealing attachment 3 with shapes which conform to the shapes of these steps or concave parts in order to create additional differential-pressure seals there. Furthermore, in the example shown in FIG. 13, the pressure difference ($P_2-P_3$) between the pressure difference chambers 4 and 5 and 5 and 6 is much smaller than ($P_0-P_1$). In the same way as shown in FIG. 1, a roller seal is formed due to a pair of sealing rollers 8 and 9 which substantially completely block the chamber to provide the seal but which do not squeeze the elongated sheet. Rollers 8 and 9 have their axes displaced from one another in the direction in which the sheet passes through the apparatus, one being in an upstream position and the other in a downstream position in relation to the direction of movement of the elongated sheet 1.

Figure 15:
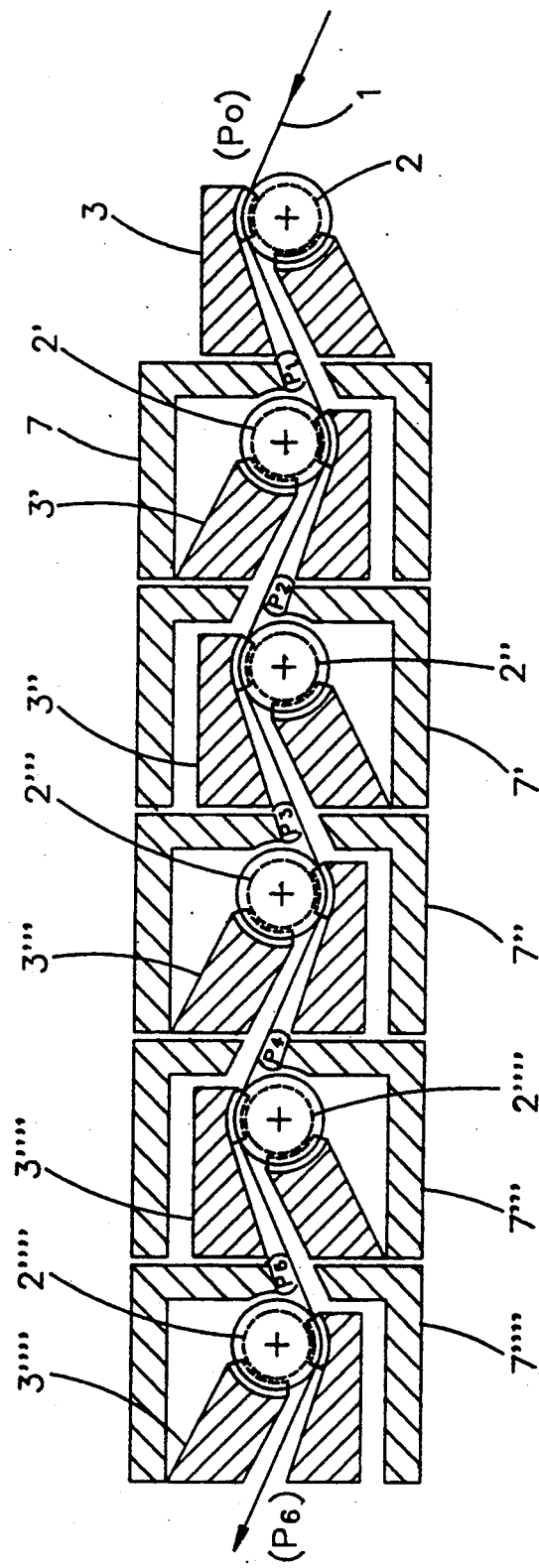
FIG. 15 is a sectional view of a portion of a still further modified apparatus in accordance with this invention.

Furthermore, FIG. 15 shows an example in which a large negative pressure difference from $P_0$ to $P_6$ can be achieved more advantageously by repeating the differential-pressure seal shown in FIG. 9 as many as six times.

Figure 16:
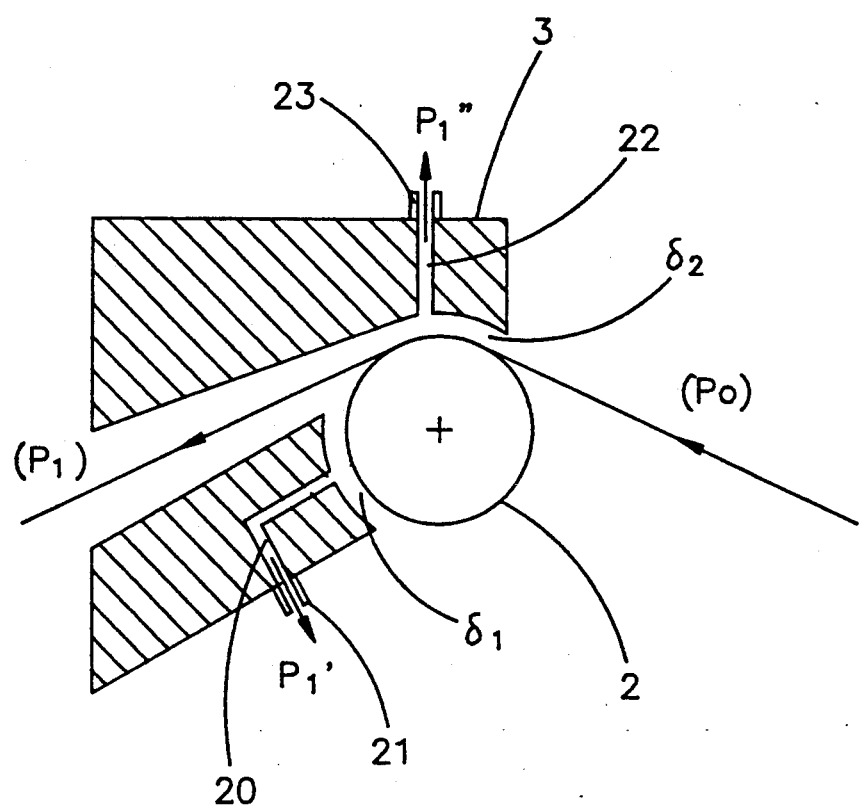
FIGS. 16, 17(a) and 17(b) are enlarged sectional views of modifications of the entrance portion of the apparatus.

FIG. 16 shows a further modification of the sealing attachment 3 wherein a vacuum passage 20 and fitting 21 are provided for applying vacuum adjacent the guide roller 2 and the lower surface of the elongated sheet 1 after it has contacted the guide roller 2. A further vacuum passage 22 and fitting 23 are provided for applying a vacuum to the upper surface of elongated sheet 1 as it wraps upon the guide roller 2.

Figure 17B:
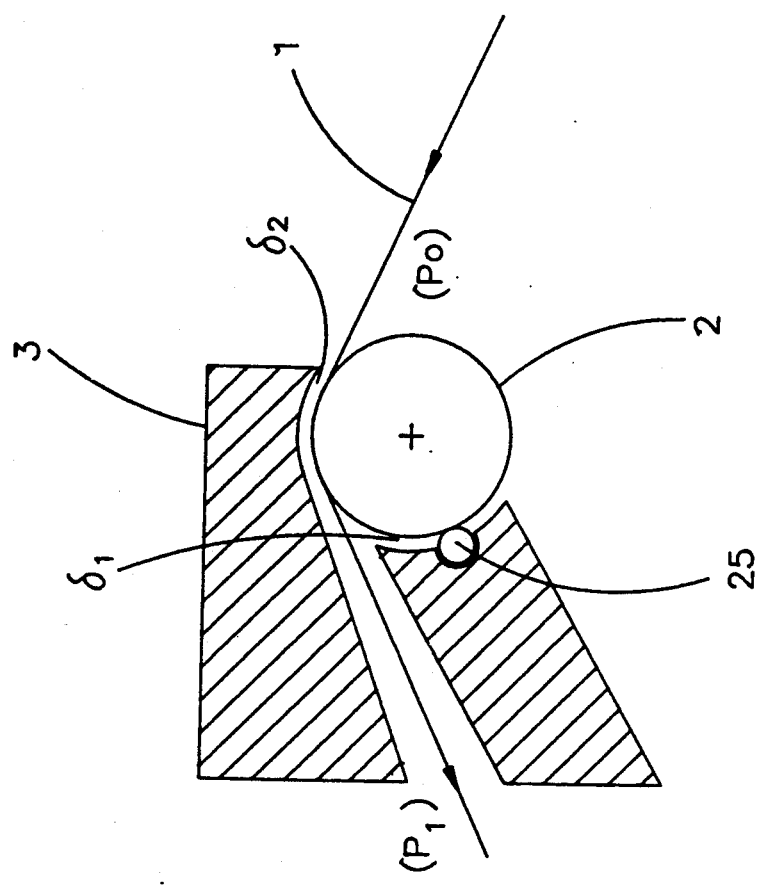
Figure 17A:
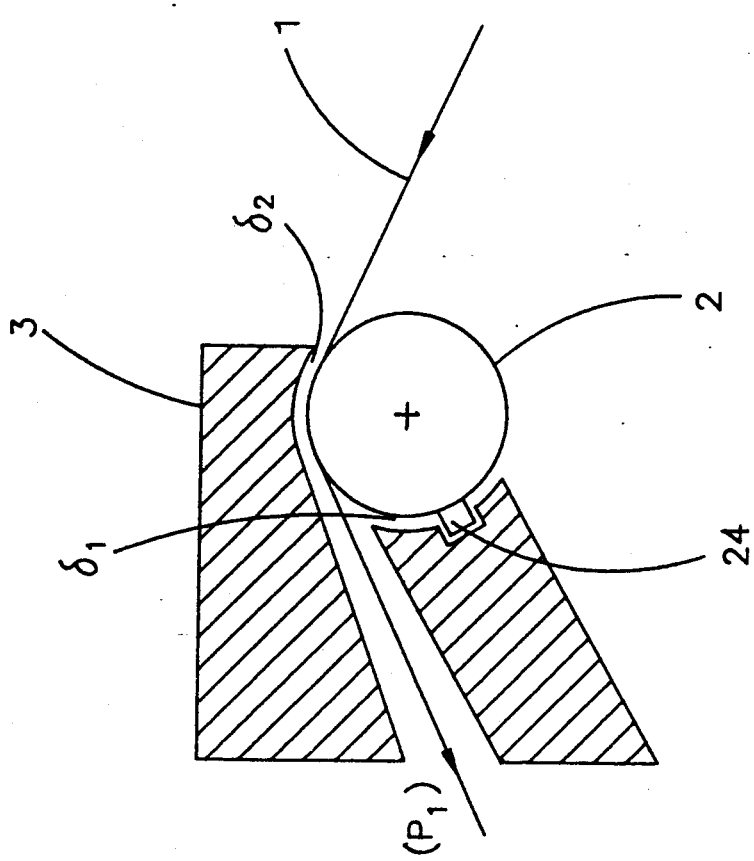

FIG. 17(a) shows a supplemental seal block 24 mounted in a hollow portion and interposed between the guide roller 2 and the lower portion of the sealing attachment 3, out of contact with the surface of the elongated sheet 1, extending at about right angles to the direction of movement of the sheet.

FIG. 17(b) shows a different form of supplemental seal in the form of a roller 25 also mounted in a hollow portion of the sealing attachment 3, and also mounted at about right angles to the direction of movement of the elongated sheet, like the block 24 of FIG. 17(a), but in many cases being capable of creating a more effective differential pressure.

It will accordingly be appreciated that this invention is directed to a differential-pressure sealing device which connects spaced areas having pressure differences among them, and permits the continuous passage of an elongated sheet while maintaining the pressure differences at the desired levels.

The sealing device according to this invention may include a single guide roller which guides the passage of the elongated sheet, which may be located between the above-mentioned spaced areas and a sealing attachment which is positioned so that it surrounds the elongated sheet with part of one of its opposed surfaces located close to the surface of the sheet of the above-mentioned roller, and shaped in such a way as to conform to the surface of the sheet; part of the other surface of the sealing attachment is positioned close to the outer surface of the above-mentioned roller, and its end is shaped in such a way to conform with the above-mentioned outer surface of the roller. This sealing surface has a side structure which conforms to the above-mentioned outer surface of the roller, the said end is placed close to the outer surface of the above-mentioned roller, and the two above-mentioned opposing parts are connected so that they maintain a substantially air-tight seal. In addition, the above-mentioned single roller is provided, on the inside, with a magnet or on the outer surface, with numerous pores which attracts the winding region of the elongated sheet to the outer surface of the roller and makes it adhere tightly to that surface.

The differential-pressure sealing device of this invention serves effectively to prevent the quality of an elongated sheet from deteriorating due to the surface pressure applied when a high differential-pressure seal is formed, without producing local surface pressure on the elongated sheet, by using only an attachment on a single guide roller, and serves to tightly adhere the elongated sheet which is being wound on the guide roller to the outer surface of the guide roller; in addition, it serves to prevent breakage of the elongated sheet caused by vibration of the elongated sheet or the associated conveyor. It is not only especially suitable for forming dry plating coatings on super-low iron loss grain oriented silicon steel sheets, but it can of course also be applied to soft steel, etc., the quality of which is readily affected by local surface pressures.

Although this invention has been disclosed with specific reference to a variety of forms of apparatus, it will be appreciated that additional variation and deviations may be made without departing from the principles of the invention. The use of magnet as disclosed in FIGS. 6-8 or the use of suction as disclosed in FIG. 5 is not necessarily a basic part of the invention. Further, features shown in one of the drawings may be combined with features shown in others of the drawings, parts may be reversed and certain features of the invention used independently with other features of the invention, all without departing from the spirit and scope of the invention as defined in the appended claims.

The following is claimed:

1. An apparatus for continuously processing an elongated sheet through successive zones of reduced pressure, comprising:
   (a) means forming at least one chamber containing at least one of said zones of reduced pressure, said chamber having an entrance through which said elongated sheet may be introduced,
   (b) vacuum means connected to maintain reduced pressure in said chamber,
   (c) a guide roller arranged adjacent to said chamber and around which said elongated sheet may be wrapped prior to entering said chamber, said guide roller including a plurality of pores and a vacuum means communicating with the interior of said guide roller and acts through said pores to suck said elongated sheet against the wrapped surface of said guide roller,
   (d) means forming a sealing structure encompassing at least a portion of said chamber entrance and a portion of said elongated sheet to restrict the passage of atmospheric air past said guide roller into said chamber,
   (e) means for wrapping said elongated sheet upon said guide roller, and
   (f) means for urging the wrapped portion of said elongated sheet tightly against the wrapped surface of said guide roller.

2. An apparatus for continuously processing an elongated grain oriented silicon steel sheet comprising:
   (a) means forming a plurality of successive differential pressure chambers, each chamber having an entrance through which said elongated sheet may be introduced,
   (b) vacuum means connected to maintain reduced pressure in said chambers,
   (c) a guide roller arranged adjacent to at least one of said chambers and around which said elongated sheet may be wrapped prior to entering said chambers,
   (d) means forming a structure encompassing at least a portion of the entrance of at least one of said chambers and a portion of said elongated sheet to restrict the passage of atmospheric air past said guide roller into said chambers,
   (e) supplemental means for drawing a vacuum between said structure and said guide roller,
   (f) means for wrapping said elongated sheet upon said guide roller, and
   (g) means for urging the wrapped portion of said elongated sheet tightly against the wrapped surface of said guide roller.

3. The apparatus defined in claim 2, wherein said structure includes an upper portion located above said guide roller and a lower portion located adjacent said guide roller below the path of movement of said elongated sheet, and wherein said supplemental vacuum means is located in at least one of said upper and lower portions of said sealing structure.

4. An apparatus for continuously processing an elongated grain oriented silicon steel sheet through successive zones of reduced pressure comprising:
   (a) means forming at least one chamber containing at least one of said zones of reduced pressure, said chamber having an entrance through which said elongated sheet may be introduced,
   (b) vacuum means connected to maintain reduced pressure in said chamber, (c) a guide roller arranged adjacent to said chamber and around which said elongated sheet may be wrapped prior to entering said chamber, (d) means forming a structure encompassing at least a portion of said chamber entrance and a portion of said elongated sheet to restrict the passage of atmospheric air past said guide roller into said chamber, said structure including an upper portion located above said guide roller and a lower portion located adjacent said guide roller below the path of movement of said elongated sheet, and wherein said lower portion includes a supplemental seal block disposed therein at a location closely adjacent to said guide roller, (e) means for wrapping said elongated sheet upon said guide roller such that the wrap contact angle between said elongated sheet and said guide roller is 15 to 120 degrees, and (f) means for urging the wrapped portion of said elongated sheet tightly against the wrapped surface of said guide roller such that the tension in said elongated sheet is 0.1 to 2.0 kg/mm$^2$.

5. An apparatus for continuously processing an elongated sheet through successive zones of reduced pressure comprising:

(a) means forming at least one chamber containing at least one of said zones of reduced pressure, said chamber having an entrance through which said elongated sheet may be introduced, (b) vacuum means connected to maintain reduced pressure in said chamber, (c) a guide roller arranged adjacent to said chamber and around which said elongated sheet may be wrapped prior to entering said chamber, (d) means forming a sealing structure encompassing at least a portion of said chamber entrance and a portion of said elongated sheet to restrict the passage of atmospheric air past said guide roller into said chamber, (e) means for wrapping said elongated sheet upon said guide roller, and (f) means for urging the wrapped portion of said elongated sheet tightly against the wrapped surface of said guide roller wherein said urging means includes a magnet located within said guide roller and forces said elongated sheet against the wrapped surface of said guide roller.

6. The apparatus defined in claim 5 wherein said magnet is an electromagnet.

7. The apparatus defined in claim 5 wherein said magnet is a permanent magnet.

8. An apparatus for continuously processing an elongated sheet through successive zones of reduced pressure, comprising:

(a) means forming at least one chamber containing at least one of said zones of reduced pressure, said chamber having an entrance through which said elongated sheet may be introduced, (b) vacuum means connected to maintain reduced pressure in said chamber, (c) a guide roller arranged adjacent to said chamber and around which said elongated sheet may be wrapped prior to entering said chamber, (d) means forming a sealing structure encompassing at least a portion of said chamber entrance and a portion of said elongated sheet to restrict the passage of atmospheric air past said guide roller into said chamber, (e) means for wrapping said elongated sheet upon said guide roller, and (f) means for urging the wrapped portion of said elongated sheet tightly against the wrapped surface of said guide roller wherein a plurality of said chambers (a) is provided adjacent one another along the direction of movement of said elongated sheet and provided with entrance and exit openings to accommodate passage of said sheet, and wherein sealing rollers are provided in a plurality of said chambers (a) adjacent to openings therein, thereby increasing their sealing effectiveness;

wherein said sealing rollers are arranged close to one of said openings which extends from one chamber to the other, one sealing roller on the upstream side and the other sealing roller on the downstream side of said opening, wherein said sealing rollers are arranged to guide said elongated sheet through an arcuate path, and wherein a plate is provided between said sealing rollers and provided with a slit providing a passage for said elongated strip.

9. An apparatus for continuously processing an elongated sheet through successive zones of reduced pressure, comprising:

(a) means forming at least one chamber containing at least one of said zones of reduced pressure, said chamber having an entrance through which said elongated sheet may be introduced, (b) vacuum means connected to maintain reduced pressure in said chamber, (c) a guide roller arranged adjacent to said chamber and around which said elongated sheet may be wrapped prior to entering said chamber, (d) means forming a sealing structure encompassing at least a portion of said chamber entrance and a portion of said elongated sheet to restrict the passage of atmospheric air past said guide roller into said chamber, said sealing structure including an upper portion located above said guide roller and a lower portion located adjacent said guide roller below the path of movement of said elongated sheet, and wherein said lower portion includes a supplemental seal block disposed therein at a location closely adjacent to said guide roller, (e) means for wrapping said elongated sheet upon said guide roller, and (f) means for urging the wrapped portion of said elongated sheet tightly against the wrapped surface of said guide roller wherein said supplemental seal block is a roller.

10. An apparatus for continuously processing an elongated sheet through successive zones of reduced pressure, comprising:

(a) means forming at least one chamber containing at least one of said zones of reduced pressure, said chamber having an entrance through which said elongated sheet may be introduced, (b) vacuum means connected to maintain reduced pressure in said chamber, (c) a guide roller arranged adjacent to said chamber and around which said elongated sheet may be wrapped prior to entering said chamber, said guide roller including a plurality of pores, (d) means forming a sealing structure encompassing at least a portion of said chamber entrance and a portion of said elongated sheet to restrict the passage of atmospheric air past said guide roller into said chamber, (e) means for wrapping said elongated sheet upon said guide roller, and (f) means including a vacuum means communicating with the interior of the guide roller and acting through said pores to suck said elongated sheet against the wrapped surface of said guide roller for urging the wrapped portion of said elongated sheet tightly against the wrapped surface of said guide roller.

11. An apparatus for continuously processing an elongated sheet comprising:

(a) means forming a plurality of successive differential pressure chambers, each chamber having an entrance through which said elongated sheet may be introduced, (b) vacuum means connected to maintain reduced pressure in said chambers, (c) a guide roller arranged adjacent to at least one of said chambers and around which said elongated sheet may be wrapped prior to entering said chambers, (d) means forming a sealing structure encompassing at least a portion of the entrance of at least one of said chambers and a portion of said elongated sheet to restrict the passage of atmospheric air past said guide roller into said chambers, (e) means for wrapping said elongated sheet upon said guide roller such that the wrap contact angle between said elongated sheet and said guide roller is 15 to 120 degrees, and (f) means for urging the wrapped portion of said elongated sheet tightly against the wrapped surface of said guide roller such that the tension in said elongated sheet is 0.1 to 2.0 kg/mm$^2$.

12. The apparatus as defined in claim 11, wherein said guide roller includes a plurality of pores and wherein said urging means includes a vacuum means communicating with the interior of said guide roller and acting through said pores in said guide roller to suck said elongated sheet against the wrapped surface of said guide roller.

13. The apparatus as defined in claim 11, wherein said sealing structure includes a concave arcuate surface shaped to form a narrow gap between said arcuate surface and the outer surface of said guide roller, wherein said sealing structure is shaped to provide close clearance between said concave arcuate surface and the outer surface of said guide roller near cylindrically longitudinal ends of said guide roller in a manner to restrict the flow of air, wherein said sealing structure includes a slit portion located downstream of said arcuate surface, and wherein the outer surface of said guide roller includes a shouldered portion shaped to conform to said concave arcuate surface of said sealing structure.

14. An apparatus for continuously processing an elongated sheet through successive zones of reduced pressure, comprising:

(a) means forming at least one chamber containing at least one of said zones of reduced pressure, said chamber having an entrance through which said elongated sheet may be introduced, (b) vacuum means connected to maintain reduced pressure in said chamber, (c) a guide roller arranged adjacent to said chamber and around which said elongated sheet may be wrapped prior to entering said chamber, (d) means forming a sealing structure encompassing at least a portion of said chamber entrance and a portion of said elongated sheet to restrict the passage of atmospheric air past said guide roller into said chamber, said sealing structure including an upper portion located above said guide roller and a lower portion located adjacent said guide roller below the path of movement of said elongated sheet, and wherein said lower portion includes a roller disposed therein at a location closely adjacent to said guide roller, (e) means for wrapping said elongated sheet upon said guide roller, and (f) means for urging the wrapped portion of said elongated sheet tightly against the wrapped surface of said guide roller.

15. In a method of continuously processing an elongated sheet through successive zones of reduced pressure, the steps which comprise:

(a) providing a chamber containing at least one zone of reduced pressure, said chamber having an entrance for introduction of said elongated sheet, (b) applying negative pressure within said chamber, (c) continuously feeding said elongated sheet around a guide roller for introduction into said chamber, (d) continuously sealing at least a portion of the chamber entrance and a portion of said entering elongated sheet to resist the passage of atmospheric air into said chamber, (e) continuously wrapping said elongated sheet around a portion of said guide roller, and (f) continuously urging by magnetic force said elongated sheet against the wrapped portion of the surface of said guide roller.

16. In a method of continuously processing an elongated sheet through successive zones of reduced pressure, the steps which comprise:

(a) providing a chamber containing at least one zone of reduced pressure, said chamber having an entrance for introduction of said elongated sheet, (b) applying negative pressure within said chamber, (c) continuously feeding said elongated sheet around a guide roller for introduction into said chamber, (d) continuously sealing at least a portion of the chamber entrance and a portion of said entering elongated sheet to resist the passage of atmospheric air into said chamber, (e) continuously wrapping said elongated sheet around a portion of said guide roller, and (f) continuously urging by application of a vacuum said elongated sheet against the wrapped portion of the surface of said guide roller.

17. In a method of continuously processing an elongated steel sheet, the steps which comprise:

(a) providing a plurality of successive differential pressure chambers, each chamber having an entrance through which said elongated sheet may be introduced, (b) applying negative pressure within said chambers, (c) continuously wrapping said elongated steel sheet around a guide roller for introduction to said chambers, (d) continuously sealing at least a portion of the entrance of at least one of said chambers and a portion of said elongated steel sheet to restrict the passage of atmospheric air past said guide roller into said chambers, (e) continuously wrapping said elongated sheet upon said guide roller such that the wrap contact angle between said elongated steel sheet and said guide roller is 15 to 120 degrees, and (f) continuously urging the wrapped portion of said elongated steel sheet tightly against the wrapped surface of said guide roller such that the tension in said elongated steel sheet is 0.1 to 2.0 kg/mm$^2$.

* * * * *